United States Patent
Liu et al.

(10) Patent No.: US 7,601,607 B2
(45) Date of Patent: Oct. 13, 2009

(54) PROTRUDED CONTACT AND INSERTION OF INTER-LAYER-DIELECTRIC MATERIAL TO MATCH DAMASCENE HARDMASK TO IMPROVE UNDERCUT FOR LOW-K INTERCONNECTS

(75) Inventors: Wuping Liu, Singapore (SG); Raymond Joy, Singapore (SG); Beichao Zhang, Singapore (SG); Liang Choo Hsia, Singapore (SG); Boon Meng Seah, Singapore (SG); Shyam Pal, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 346 days.

(21) Appl. No.: 11/434,318

(22) Filed: May 15, 2006

(65) Prior Publication Data
US 2007/0264820 A1 Nov. 15, 2007

(51) Int. Cl.
*H01L 21/4763* (2006.01)
(52) U.S. Cl. .................. 438/424; 438/427; 438/435; 438/437; 438/637; 438/643; 257/E21.035; 257/E21.233; 257/E21.244; 257/E21.551; 257/E21.572
(58) Field of Classification Search ......... 438/637–640, 438/738–739, 717, 424–437, 629, 643, 692, 438/693, 700, 706, 723, 724, 743, 758; 257/E21.035, 257/233, 244, 546, 549, 551, 572
See application file for complete search history.

(56) References Cited

U.S. PATENT DOCUMENTS

| | | | | |
|---|---|---|---|---|
| 5,578,518 A | * | 11/1996 | Koike et al. | 438/424 |
| 6,080,637 A | * | 6/2000 | Huang et al. | 438/424 |
| 6,184,142 B1 | | 2/2001 | Chung et al. | |
| 6,191,004 B1 | * | 2/2001 | Hsiao | 438/435 |
| 6,541,382 B1 | * | 4/2003 | Cheng et al. | 438/692 |
| 6,723,617 B1 | * | 4/2004 | Choi | 438/424 |
| 6,794,269 B1 | * | 9/2004 | Gopalan et al. | 438/427 |
| 6,812,131 B1 | | 11/2004 | Kennedy | |
| 7,358,150 B2 | * | 4/2008 | Hempel et al. | 438/435 |
| 2002/0090763 A1 | * | 7/2002 | Tseng | 438/149 |
| 2003/0232504 A1 | | 12/2003 | Eppler et al. | |
| 2004/0147111 A1 | | 7/2004 | Huang et al. | |
| 2004/0175932 A1 | * | 9/2004 | Kim et al. | 438/637 |
| 2005/0202671 A1 | * | 9/2005 | Huang et al. | 438/637 |
| 2005/0233584 A1 | * | 10/2005 | Jeon et al. | 438/675 |
| 2006/0223250 A1 | * | 10/2006 | Romero et al. | 438/197 |
| 2007/0059897 A1 | * | 3/2007 | Tilke et al. | 438/424 |

* cited by examiner

*Primary Examiner*—Michael S Lebentritt
(74) *Attorney, Agent, or Firm*—Horizon IP Pte Ltd

(57) ABSTRACT

An embodiment of the invention shows a process to form a damascene opening preferably without hardmask overhang or dielectric layer undercut/void. The low-k dielectric material can be sandwiched in two hardmask films to form the dielectric film through which an interconnect opening is etched. A first example embodiment comprises the following. We form a lower interconnect and an insulating layer over a semiconductor structure. We form a first hardmask a dielectric layer, and a second hardmask layer, over the lower interconnect and insulating layer. We etch a first interconnect opening in the first hardmask, the dielectric layer and the second hardmask layer. Lastly, we form an interconnect in the first interconnect opening.

28 Claims, 3 Drawing Sheets

PROTRUDED CONTACT AND INSERTION OF INTER-LAYER-DIELECTRIC MATERIAL TO MATCH DAMASCENE HARDMASK TO IMPROVE UNDERCUT FOR LOW-K INTERCONNECTS

BACKGROUND OF INVENTION

1) Field of the Invention

This invention relates generally to fabrication of semiconductor devices with interconnect opening and more particularly to the fabrication of a interconnect opening using hardmasks and dielectric layers and etch processes.

2) Description of the Prior Art

As integration density of an integrated circuit device increases, the size of a semiconductor device and interconnection lines thereon becomes smaller and smaller. In order to build more semiconductor devices in a given cell plane with reduced area, three-dimensional semiconductor devices and interconnection lines are being employed. A three-dimensional interconnection line is typically shown in multi-level metallization. Multi-level metallization is carried out as a post-process after a preprocess such as forming a transistor, forming a capacitor and forming a bit line.

Current methods for forming via contact opening in low k materials using hardmask need to be improved.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 6,812,131: Kennedy—Use of sacrificial inorganic dielectrics for dual damascene processes utilizing organic intermetal dielectrics—Production of conducting vias and conducting lines for integrated circuits in semiconductor devices, comprises depositing sacrificial inorganic dielectric in via opening to fill via opening and cover top surface of stack.

US2004014711A1: Huang et al.—Polycarbosilane buried etch stops in interconnect structures—Interconnect structure useful in integrated circuits and microelectronic devices comprises a buried etch stop layer containing a polymeric material, a via level interlayer dielectric.

US20030232504A1: Eppler et al.—Process for etching dielectric films with improved resist and/or etch profile characteristics—Dielectric layer etching for integrated circuit production, involves setting ratio of silane gas to fluorocarbon gas and ratio of hydrogen gas to fluorocarbon gas in etchant gas, to specific range.

U.S. Pat. No. 6,184,142: Chung et al.—Process for low k organic dielectric film etch—Etching of an organic film having low dielectric constant, for use as an interlevel dielectric film, by etching using hardmask layer as mask to transfer the pattern into the low dielectric constant organic layer

SUMMARY OF THE INVENTION

Some example embodiments of the present invention provides a structure and a method of manufacturing an interconnect or damascene opening in a dielectric layer and hardmask layers that minimize overhang by the hardmask layers which is characterized as follows.

A first example embodiment comprises: the following:
  forming a lower interconnect and an insulating layer over a semiconductor structure; a portion of the lower interconnect is exposed;
  forming a first hardmask over the lower interconnect and the insulating layer;
  forming a dielectric layer over the first hardmask layer;
  forming a second hardmask over the dielectric layer;
  etching a first interconnect opening in the first hardmask, the dielectric layer and the second hardmask layer;
  forming an interconnect in the first interconnect opening.

An aspect of the first example embodiment further comprises: the first and second hardmasks are comprised of the same material.

A second aspect comprises: the following:
  forming a lower interconnect and insulating layer over a semiconductor structure;
  forming a first hardmask over the lower interconnect and the insulating layer;
  forming a dielectric layer over the first hardmask layer;
  forming a second hardmask over the dielectric layer;
  in a first etch step, etching a first interconnect opening in the first hardmask, the dielectric layer and the second hardmask layer; the first hardmask has an first hardmask overhang and the second hardmask has a second hardmask overhang where the first and second hardmask overhangs extend out past the sidewall of the dielectric layer;
  in a second etch step, etching the first and second hardmask overhangs and the dielectric layer form a first overhang-less interconnect opening; the second etch step essentially removes the first and second hardmask overhangs;
  forming an interconnect in the first overhang-less interconnect opening.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 5 is not admitted prior art.

DETAILED DESCRIPTION OF THE EXAMPLE EMBODIMENTS

A. Overview

The example embodiments of the present invention will be described in detail with reference to the accompanying drawings. The example embodiments provide a method of forming interconnect openings and forming an interconnect. The example embodiment can form the interconnect opening without a lower interconnect undercut and hardmask overhangs.

An example embodiment of the invention shows a process to form a damascene opening without hardmask overhang or ILD/IMD layer undercut. A lower hardmask layer is formed over the insulating layer. A low K or ultra low K dielectric layer is formed over the lower hardmask layer. An upper hardmask layer is formed over the dielectric layer. The IMD Layer can be comprised of the lower hardmask, dielectric layer and upper hardmask. Through this method, aggressive post-etch clean is applicable to improve trench overhang while undercut at low-k-contact ILD interface is avoided.

Figure 1A:
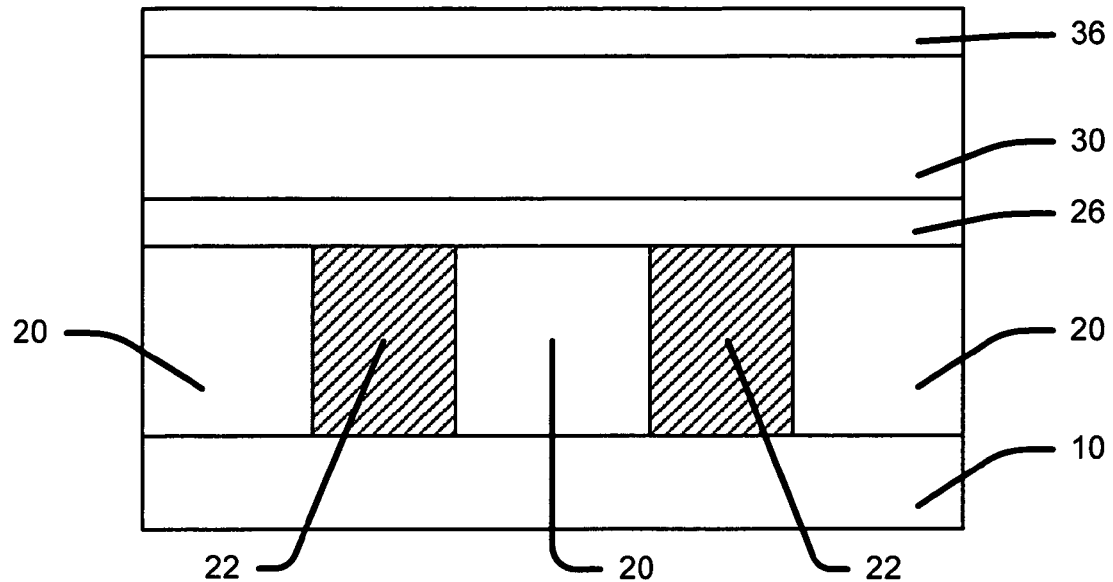
FIGS. 1 through 4 are cross sectional views for illustrating a method for manufacturing an interconnect opening according to an example embodiment of the present invention.

B. Form a Lower Interconnect and Insulating Layer Over a Semiconductor Structure As shown in FIG. 1, we form a preferably slightly protruded lower interconnect 22 and insulating layer 20 over a semiconductor structure. The protrusion has typically a value between 100 and 400 angstroms. The insulating layer 20 can be an interlevel dielectric (IDL) layer or an inter metal dielectric (IMD) layer. An IDL layer is the lowest level dielectric layer formed through which contacts are made. The semiconductor structure can be a substrate as a silicon substrate. The lower interconnect can be a contact to the substrate and the insulating layer 20 can be the lowest level dielectric layer on or over the substrate.

C. Form a First Hardmask Over the Lower Interconnect and Dielectric Layer

Next, we form a first hardmask 26 over the lower interconnect 22 and dielectric layer 20. The first hardmask layer can be formed over any level of contacts or higher level interconnect layers (e.g., M1, M2, M3). The first hardmask can be on or in contact with the insulating layer 20.

The first hardmask 26 can be comprised of silicon oxide (such as silicon oxide formed using TEOS reactants), doped-oxide (such as FTEOS), or low-temperature (deposited below 200 C) silicon oxide. The first hardmask 26 is preferably comprised of oxide and has a thickness between 500 and 1000 angstroms.

The hardmask layers preferably have good planarization and adhesion properties.

D. Form a Dielectric Layer

We form a dielectric layer 30 (e.g., IMD layer) over the first hardmask layer 26.

The dielectric layer 30 can be comprised of carbon doped oxides (e.g., SiCOH), CVD low-k (e.g., SiCOH) (K<3.0), Fluorinated Silicate glass (FSG or SiOF), spin-on coating low-k (e.g. SILK T dielectric by Dow Chemical) or CVD Ultra-Low-K (ULK, K<2.5). The dielectric layer 30 can have a thickness between 1500 and 3000 angstroms.

The dielectric layer 30 can have a thickness about 1500 angstroms for single damascene and about 3000 angstroms for dual damascene The dielectric layer 30 preferably has the etch properties having good damage resistance to fluorine-oxygen plasma A low-k dielectric may include organic materials, silicate materials, or a hybrid of both organic and silicate materials, such as organosilicate glass (OSG). For a device with design rules of 130 nm and beyond, Silicon Oxide may be doped with Methyl (—CH3) groups to form a Carbon-doped Silicon Oxide (CDO or SiOC) having k with a value of between about 2.4 and 3.3.

The dielectric layer 30 may be formed from a low-k material having an ultra-low k. Ultra-low k refers to a value of k that is lower than about 2.2. The dielectric layer may be formed from a material having k with a value below about 1.5. Materials with an ultra-low k are usually porous and may include aerogels and xerogels.

The dielectric layer 30 may be formed using a chemical vapor deposition (CVD) process. A low-k material that may be formed using a plasma-enhanced CVD (PECVD) process includes Black Diamond (a CDO having k with a value of about 2.4-3.1) from Applied Materials, CORAL (a CDO having k with a value of about 2.4-2.8) from Novellus Systems, and Flowfill@ (a CDO having k with a value of about 2.5-2.8) from Trikon Technologies. An ultra-low k material that may be formed using PECVD includes Orion (a CDO having k with a value of about 2.0-2.2) from Trikon Technologies. A tool that may be used to form the low-k or ultra-low k material includes a Producer@ system from Applied Materials. A SEQUEL Express system or a VECTORz system from Novellus Systems may also be used.

Alternatively, the dielectric 30 may be formed from a spin-on dielectric (SOD). In some cases, the SOD may require the use of an adhesion layer. Low-k materials that may be formed using a spin-on process from a liquid source include SiLK (an aromatic hydrocarbon polymer having k with a value of about 2.65) from Dow Chemical and HOST"" (a hybrid organic-siloxane polymer or OSG having k with a value of about 2.5) from Honeywell Electronic Materials (HEM). An ultra-low k material that may be spun-on includes NANOGLASSX (a porous Silica having k with a value of about 1.3-2.2) from HEM. A tool that may be used to form the low-k or ultra-low k material includes a spin track from Tokyo Electron Ltd. (TEL).

The dielectric layer can be comprised of one or more layers.

E. Form a Second Hardmask Over the Dielectric Layer

Next, we form a second hardmask 36 over the dielectric layer 30.

The second hardmask 36 can be comprised of oxide such as TEOS, doped oxide such as FTEOS or low-temperature oxide and has a thickness between 250 and 1000 angstroms.

The first and second hardmask are preferably comprised of the about or essentially the same material and about the same thicknesses and essentially the same etch characteristics and made by the same process. For example the first and second hardmask can have a thickness within +/−10%.

F. Form Resist Layer and Etch Hardmask Opening

Figure 1B:
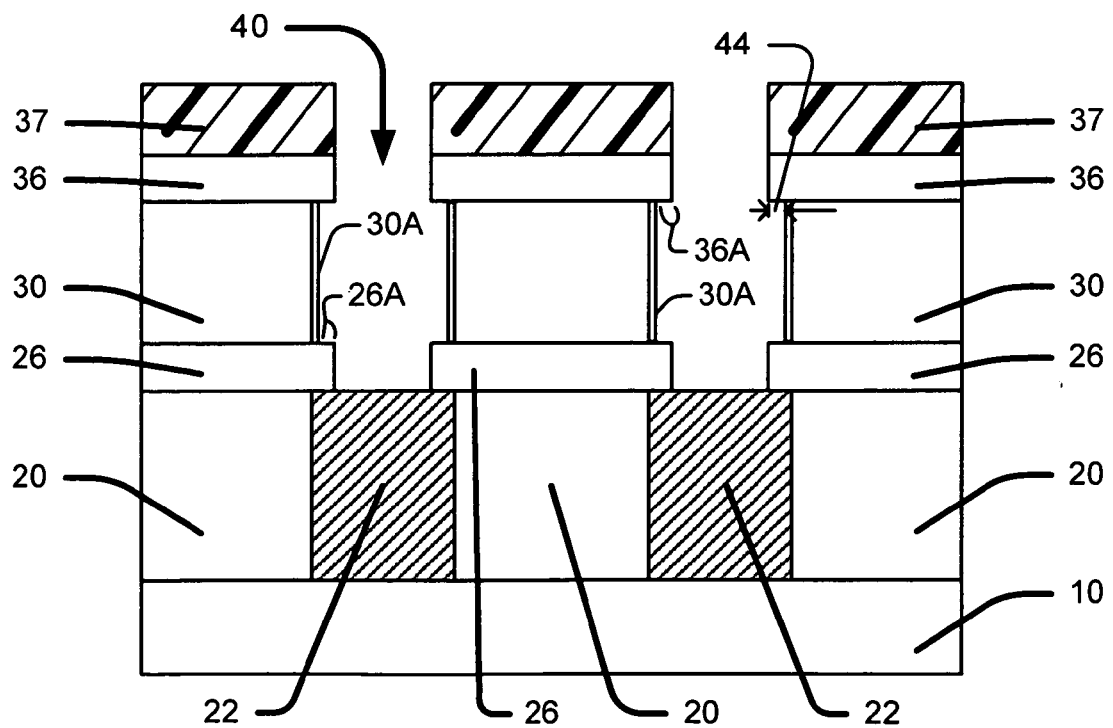

Referring to FIG. 1B, we form a resist layer 37 over the second hardmask layer 36. The resist layer has opening where the interconnect openings will be formed.

G. First Etch Step—Etching a First Interconnect Opening—Can Form Hardmask Overhangs Referring to FIG. 1B, in a first etch (e.g., CF etch) step, we etch a first interconnect opening 40 in the first hardmask 26, dielectric layer 30 and the second hardmask layer 36. The first etch also causes damage to the dielectric layer 30 to form a damaged dielectric layer 30A on the sidewalls of the dielectric layer 30 lining the opening.

The first hardmask 26 has an first hardmask overhang region 26A and the second hardmask 36 has a second hardmask overhang region 36A where the first and second hardmask overhangs 26A 36A extend out past edge of the dielectric layer 30 sidewall. The overhangs 26B 36B are formed by damaged low-k dielectric during plasma etch or oxygencontained resist strip which are removed by second wet-chemical or dry etch. The etch stops inside the first hardmask without touching ILD dielectric 20.

The first etch can have an between 1:1 and 2:1 and more preferably about 1:1 etch selectivity between the dielectric layer 30 and the first and second hardmasks 26 36.

As shown in FIG. 1B, the first and second hardmask overhang regions 26A 36A have a width 44. The first interconnect opening can have any shape such as a single damascene opening or a dual damascene shaped opening.

Typical dry etch process uses Carbon-fluorine chemistry with different additives (e.g., $O_2$, Ar, $N_2$, CO, $H_2$) at temperature between 20 and 100 degree C., at a pressure between 10 and 100 mTorr. The etch can be conducted on commercially available etchers, e.g., TEL, Lam, AMAT etchers.

The etch parameters which are important to create the lateral etch of the dielectric layer 30 are the oxygen gas-flow/partial-pressure and fluorocarbon gas flow with high fluorine-carbon ratio. Oxygen and fluorine are also prime parameters creating etch (damage) to low-k. The concentration of wet-etch chemicals and process duration are primary parameters that affect the lateral etch of the dielectric layer 30 and therefore the overhang 26A 36A of the hardmask layers.

The dielectric layers 30 comprised of carbon-contained CVD or ULK are prone to damage under fluorocarbon gas with oxygen additives. Due to Carbon-extraction, a low-k damage layer will be created at low-k surface at trench side wall, and leave a recess related to hardmask after second wet-chemical or dry etch.

The first etch creates the overhangs 26A 36A because the damage dielectric layer 30A generated by dry-etch is nonstoichiometric oxide, which has faster wet-chemical etch rate than hardmask. Low-k materials, layer 30 on the other hand, is more organic-like and experiences slower wet-chemical etch rate in aqueous-basis solution. This difference in wet-chemical etch rate among hardmask 26 36, low-k layer 30 and damaged dielectric layer 30A can create overhang.

The first etch can have an (dry) etch selectivity to the dielectric layer 30 compared to the first and second hardmasks 26 36 between 1.0 to 5.0. The wet chemical etch rate of hardmask is usually >10-time faster than low-k dielectrics.

H. Remove Resist Layer

Figure 2:
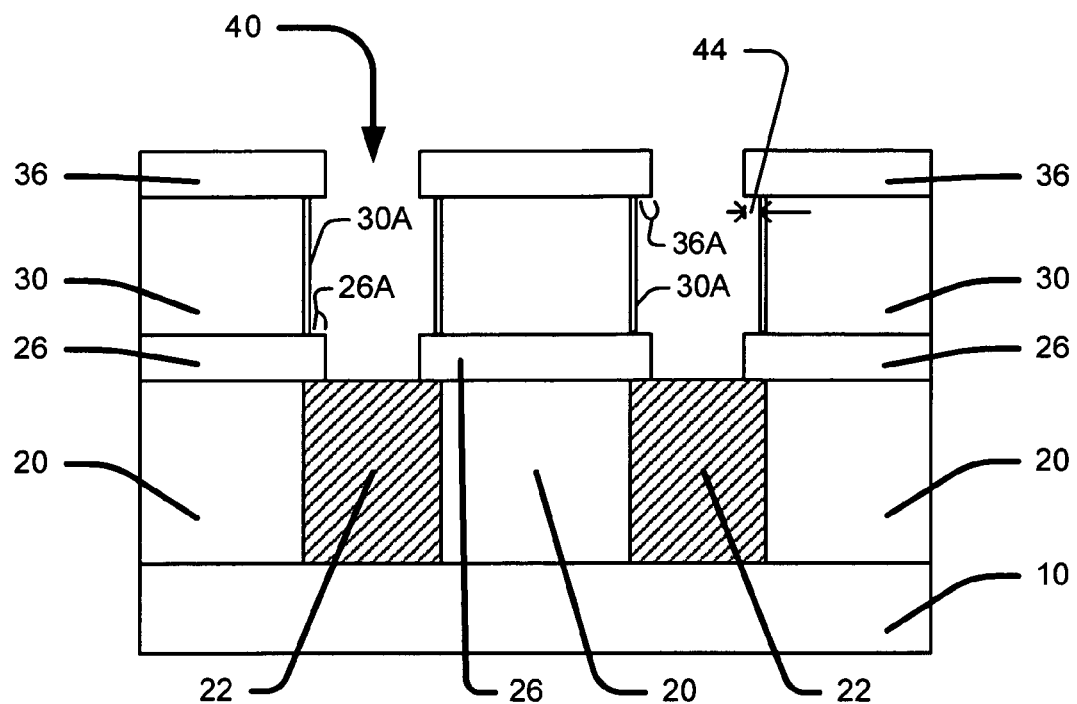

Referring to FIG. 2, we remove the resist layer 37. The resist layer 37 is removed using oxidant gas mixture ($O_2$, CO, Ar), or alternatively reducing agents ($NH_3$, $N_2/H_2$, CO, $CO_2$), or their mixture with additives, or wet chemical solution, with preferably dry process.

Resist removal step may or may not cause hardmask loss, in dependent on the resist removal approach. In an in-situ scheme, of which resist removal is conducted in the same chamber as dielectric etch, 10-70% loss of the total hardmask may occur during resist removal.

As shown in FIG. 2, the first and second hardmask overhang region 26A 36A can have a width 44 between 3 and 15 nm. The first interconnect opening 40 can have a diameter between 60 nm and 140 nm. The first interconnect opening can have any shape such as a single damascene opening or a dual damascene shaped opening.

Figure 3:
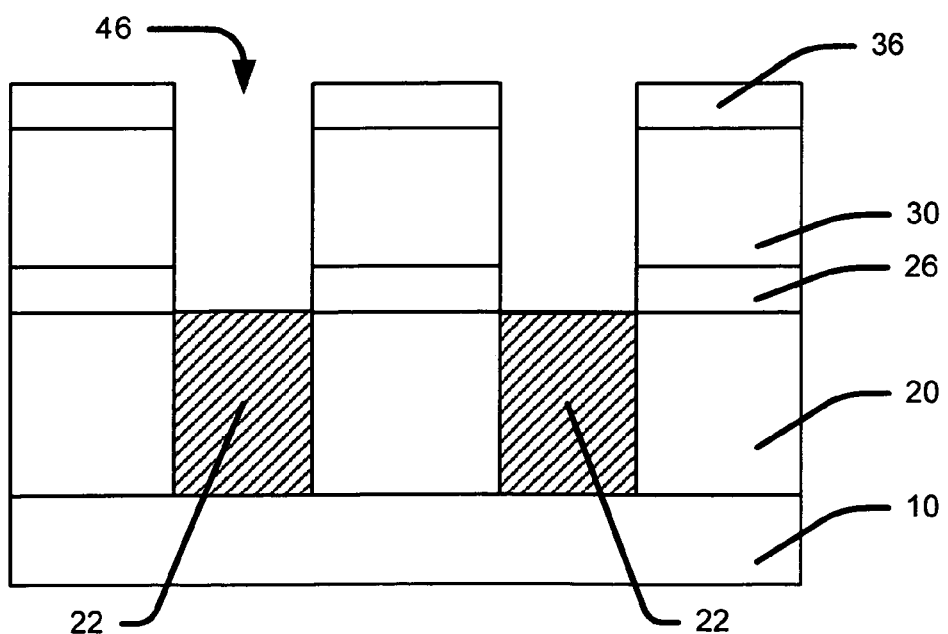

I. In a Second Etch Step, We Etch and (Aggressive Post Etch) Clean the First Interconnect Opening Second Etch Step Referring to FIG. 3, in a second etch step, we etch the damaged dielectric liner 30A, the dielectric layer 30, hardmasks and the hardmask overhangs 26A 36A of the hardmask layers 26 36 to remove the overhangs and form a first overhang-less interconnect opening 46. The second etch also cleans the opening. The second etch can be a wet or dry etch as long as the etch has the proper etch selectivity between the hardmask overhangs and the dielectric used for lower interconnect and low-k interconnect.

Second Etch (Wet)

The second etch can be a diluted hydrofluoride (dHF) solution such as a 100 to 600:1 dHF solution. The clean etches the overhangs 26A at a faster rate than the dielectric layer 30 because the CVD low-k 30 is more organic-like and hydrophobic than the hardmask 26 36.

The second etch can be an ammonium-fluoro-based aqueous solution.

The second etch can use commercially available chemicals for wet-cleaning (e.g. ST series, NE series) which are weak alkaline or acidic solutions for HM removal. Typical wet chemical solutions are composed of organo-amine, ammonium fluoride, organic acid, and additives. Wet etch can be conducted on wet-bench or single-wafer processing tools at temperature between 20-100 degree C. Concentration of acid and cleaning duration are important parameters which affect hardmask removal and selectivity to low-k.

The preferred second etch selectivity between dielectric 30 and the hardmasks 26 36 range is between about 1:5 and 1:100.

The preferred etch selectivity between the hardmasks 26 36 and the damage dielectric layer 30A is between 1:1 and 2:1.

Second Etch (Dry)

In addition, the clean/etch can be a dry etch for hardmask removal. Commercially available tools can be used. Flow rate of additives ($O_2$, CO, $H_2$, Ar, $N_2$, $NH_3$), type of Carbon-fluorine and power are important parameters to control etch selectivity between hardmask and low-K materials.

The $2^{nd}$ etch step (clean) can etch the hardmask overhangs selective to the dielectric layer because dependent on the chemical composition & property of the low-k materials, aqueous-basis wet solution or solvent-basis wet solution can be chosen to selectively remove hardmask.

For example, selective removal of oxide-like hardmask related to CVD low-k can be achieved with diluted HF solution. A mechanism is that compared to low-k materials which contain C, oxide-like hardmask are more inorganic-like/hydrophilic. Varied selectivity to low-k materials can be achieved by adjusting HF concentration.

The preferred etch selectivity between the hardmasks 26 36 and the damage dielectric layer 30A between 1:1 and 2:1.

TABLE example hardmask/IMD layers and $2^{nd}$ step etch process to remove the overhangs

| Hardmask 26 36 composition | dielectric layer 30 composition | $2^{nd}$ etch/clean - parameters details (e.g., power, CF ratios, etc) | preferred etch selectivity between hardmask and damage layer |
|---|---|---|---|
| Oxide | SiCOH, spin-on coating low-k, CVD ULK | Dry etch: CHxFy, <1000 w RF power, CO/N2/Ar additives; | >1:1 |
| | | Wet-chemical etch: 100-300 diluted HF, or ammonium-fluoro-based buffer solution | >1:1 |

TABLE-continued example hardmask/IMD layers and 2$^{nd}$ step etch process to remove the overhangs

| Hardmask 26 36 composition | dielectric layer 30 composition | 2$^{nd}$ etch/clean - parameters details (e.g., power, CF ratios, etc) | preferred etch selectivity between hardmask and damage layer |
|---|---|---|---|
| Dopped oxide | SiCOH, spin-on coating low-k (e.g. SILK), CVD ULK | Dry etch: CH$x$F$y$, <1000 w RF power, CO/N2/Ar additives; | >1:1 |
|  |  | Wet-chemical etch: 100-300 diluted HF, or ammonia-fluoro-based buffer solution | >1:1 |
| oxide like low-temperature oxide | SiCOH, spin-on coating low-k, CVD ULK | Dry etch: CH$x$F$y$ or C$x$F$y$, <1000 w RF power, CO/N2/Ar additives; | >1:1 |
|  |  | Wet-chemical etch: 100-300 diluted HF, or ammonia-fluoro-based buffer solution | >1:1 |

After the second etch/clean step, the hardmask vertical surface can be within between 0 and 30 angstroms and preferably between 10 and 30 angstroms of the vertical dielectric surface. That is, the hardmask overhangs preferably have a width between 0 and 30 angstroms and preferably between 10 and 30 angstroms after the second etch or clean step. The first overhang-less interconnect opening 46 is about or essentially overhang-less (about or essentially no hardmask overhangs).

J. Form an Interconnect in the First Overhang-Less Interconnect Opening

Figure 4:
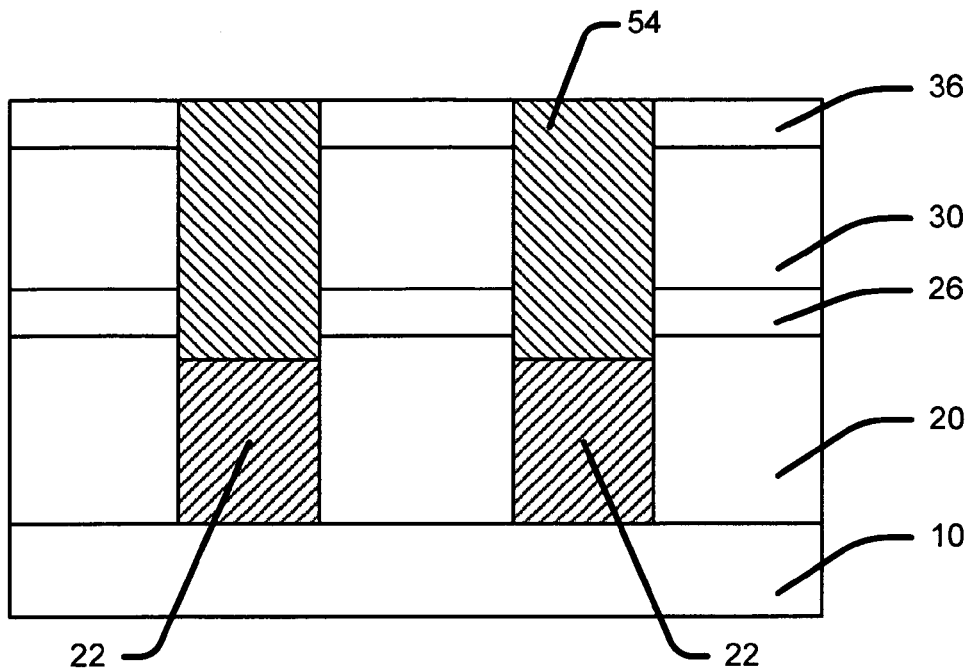

Referring to FIG. 4, we form an interconnect 54 in the first overhang-less interconnect opening 46.

The interconnect can be comprised of copper and is formed using a damascene process.

K. A Problem that can be Reduced by Some Example Embodiments

When we integrate hardmask with low-k for shrunk feature size at nano-regime, a critical issue is overhang trench profile formed atop of low-k materials, which causes metallization void. One of the approaches to minimize overhang is to choose an aggressive post-etch wet clean method, such as diluted hydrofluoride (dHF) solution.

Figure 5:
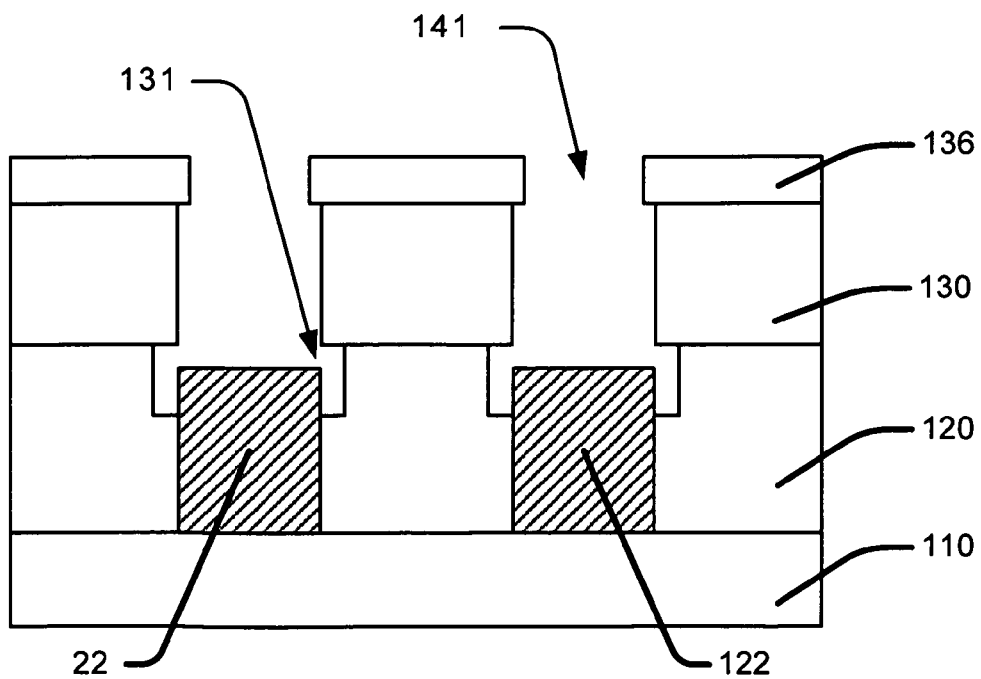
FIG. 5 shows a cross sectional view for illustrating a method for manufacturing an interconnect opening that can create a void problem.

FIG. 5 shows a cross sectional view of lower interconnect 122 in a dielectric layer 120 over a substrate 110. A low k IMD layer 130 is formed on the dielectric layer 120. An upper hardmask 136 is formed on the dielectric layer 120. An interconnect opening 141 is formed in the Low k IMD layer 130 using a two step process similar to above.

In situations when Inter-Layer-Dielectric (ILD) material 120 for contact is different from hardmask 136 and presents higher etch rate, a drawback of aggressive clean (second etch step) is its attacking the ILD material 120 and results in trench under-cut and ILD void 131 at interface between the low-k-dielectric 130 and contact ILD 120. This adversely affects device reliability and performance.

In contrast, the embodiment's implementation of hardmask-low K-hardmask and identical hardmask scheme allows elimination/minimization of hardmask-to-low K and low K-to-interlayer dielectric undercut/void during aggressive trench clean. See e.g., FIGS. 3 and 4.

L. Non-Limiting Example Embodiments

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of an interconnect opening for a semiconductor device; comprising the steps of:
   forming a lower interconnect and an insulating layer over a semiconductor structure;
   forming a first hardmask over said lower interconnect and said insulating layer;
   forming a dielectric layer over said first hardmask layer;
   forming a second hardmask over said dielectric layer;
   in a first etch step, etching a first interconnect opening in said first hardmask, said dielectric layer and said second hardmask layer;
      the dielectric layer in said first interconnect opening has sidewalls; the first hardmask has an first hardmask overhang and the second hardmask has a second hardmask overhang where said first hardmask overhang and said second hardmask overhang extend out past the sidewall of the dielectric layer;
   in a second etch step, etching the first and second hardmask overhangs and the dielectric layer form a first overhang-less interconnect opening; the second etch step essentially removes said first and second hardmask overhangs;
   forming an interconnect in said first overhang-less interconnect opening.

2. The method of claim 1 wherein in the first etch step, the etch has an etch selectivity from the dielectric layer to the first and second hardmasks between 1:1 and 2:1.

3. The method of claim 1 wherein in the second etch step, the etch has an etch selectivity between the dielectric layer and the first and second hardmasks between about 1:5 and 1:100.

4. The method of claim 1 which further in comprises:
   the first etch forms a damaged dielectric liner on said sidewalls of the dielectric layer;
   said damaged dielectric liner is comprised of a nonstoichiometric oxide;
   the second etch removes said damaged dielectric liner.

5. The method of claims 1 wherein said first hardmask and said second hardmask are comprised of oxide doped oxide; a fluorine doped oxide or low-temperature oxide; and has a thickness between 500 and 1000 angstroms.

6. The method of claim 1 wherein said dielectric layer is comprised of a low K material or ultra low K material.

7. The method of claim 1 wherein said dielectric layer is comprised of: carbon doped oxide (SiCOH), carbon containing low K dielectric with a dielectric constant less than 3.0, spin on low-k dielectrics or CVD ultra-low-k dielectrics and has a thickness between 1500 and 3000 angstroms.

8. The method of claim 1 wherein said first hardmask and said second hardmask is comprised of oxide, doped oxide or low-temperature oxide;
    said dielectric layer is comprised of a material selected from the group consisting of carbon doped oxide (SiCOH), carbon containing low K dielectric with a dielectric constant less than 3.0, spin on low-k dielectrics and CYD ultra-low-k.

9. The method of claim 1 wherein after the first etch step and before the second etch step, the first and second hardmask overhangs have a width between 3 and 15 nm; the first interconnect opening has a diameter between 60 nm and 140 nm; and
    after the second etch step, the first and second hardmask overhangs have a width between 0 and 30 angstroms.

10. The method of claim 1 wherein the first etch step comprises: a Carbon-fluorine chemistry, a temperature between 20 and 100 degree C; a pressure between 20 and 100 mTorr, a Radio-frequency power <1000 w, with $N_2$, $H_2$, CO or/and Ar additives;
    the first etch step has an etch selectivity between 1:1 to 2:1 of the dielectric layer to the first & second hardmasks.

11. The method of claim 1 wherein the second etch comprise a wet dilute HF etch with a etch selectivity between the hardmask and the dielectric layer between 1:1 and 2:1.

12. The method of claim 1 wherein said first and said second hardmask are comprised of essentially the same material.

13. A method of fabrication of an interconnect opening for a semiconductor device; comprising the steps of:
    a) forming a lower interconnect and insulating layer over a semiconductor structure;
    b) forming a first hardmask over said lower interconnect and insulating layer;
        (1) said first hardmask is comprised of a material selected from the group consisting of: oxide, doped oxide or low-temperature oxide;
    c) forming a dielectric layer over said first hardmask layer;
        (1) said dielectric layer is comprised of a material selected from the group consisting of: SiCOH, carbon containing low K dielectric, spin on low-k dielectrics, porous silica glass, organo silica glass, aromatic hydrocarbon materials, and CVD ultra low-k dielectric;
    d) forming a second hardmask over said dielectric layer;
        (1) said second hardmask is comprised of a material selected from the group consisting of: oxide, doped oxide or low-temperature oxide;
    e) in a first etch step, etching a first interconnect opening in said first hardmask, dielectric layer and said second hardmask layer; the first hardmask has an first hardmask overhang and the second hardmask has a second hardmask overhang where the first and second hardmask overhangs extend out past the sidewall of the dielectric layer; the first etch forms a damaged dielectric layer from the dielectric layer lining the first interconnect opening;
        (1) the first etch step comprises: using a carbon-fluorine chemistry; the first etch step has an etch selectivity between 1:1 to 2:1 of the dielectric layer to said first hardmask and said second hardmask;
    f) in a second etch step, etching damaged dielectric layer and the overhangs of the hardmask layers to remove said first and second hardmask overhangs and form a first overhang-less interconnect opening and cleaning said first overhand-less interconnect opening;
        (1) the second etch comprises an etch with an etch selectivity between the damaged dielectric layer and the hardmask between 1:1 and 2:1;
    g) forming an interconnect in said first overhang-less interconnect opening.

14. The method of claim 13 wherein in the second etch step, the etch has an etch selectivity between the dielectric layer and said first hardmask and said second hardmask between about 1:5 and 1:100.

15. The method of claim 13 wherein in the first etch step, the first etch step comprises: using a carbon-fluorine chemistry, at a temperature between 20 and 100 degree C; at a pressure between 10 and 100 mTorr, at a radio-frequency power <1000 w, with $N_2$, $H_2$, CO or/and Ar additives.

16. The method of claim 13 wherein the second etch comprise a wet dilute HF etch or a dry etch.

17. The method of claim 13 wherein said first and said second hardmasks are comprised of essentially the same material.

18. The method of claim 13 wherein said insulating layer is an interlevel dielectric layer and said lower interconnect is a contact to a substrate.

19. A method of forming a semiconductor device comprising:
    providing a substrate prepared with a dielectric stack, the dielectric stack comprising a dielectric layer formed in between first and second dielectric hardmask layers; and
    performing a first etch to form an opening through the first and second hardmask layers and the dielectric layer to expose sidewalls of the hardmask layers and dielectric layer, wherein sidewalls of the first and second hardmask layers extend beyond sidewalls of the dielectric layer to form first and second overhang regions by the first and second hardmask layers.

20. The method of claim 19 wherein the first and second hardmask layers comprise the same material.

21. The method of claim 19 wherein the first etch damages the sidewalls of the dielectric layer to form damaged portions lining the sidewalls of the dielectric layer.

22. The method of claim 21 wherein the damaged portions and hardmask layers have an etch selectivity of about 1:1 to 2:1 in a subsequent etch.

23. The method of claim 21 wherein
    the sidewalls of the first and second hardmask layers are co-planar.

24. The method of claim 19, 20-22 or 23 further comprises performing a second etch, wherein the second etch produces sidewalls of the first and second hardmask layers which are coplanar with sidewalls of the dielectric layer.

25. The method of claim 24 wherein the second etch comprises a wet etch.

26. The method of claim 24 wherein the opening comprises an opening for an interconnect line and further comprises filling the opening to form the interconnect line.

27. A method of forming a semiconductor device comprising:
    providing a substrate prepared with a dielectric stack, the dielectric stack comprising a dielectric layer formed in between first and second dielectric hardmask layers;

performing a first etch to form an interconnect line opening through the first and second hardmask layers and the dielectric layer to expose sidewalls of the hardmask layers and dielectric layer, wherein sidewalls of the dielectric layer are non-coplanar with sidewalls of the first and second hardmask layers in the interconnect line opening;

performing a second etch, wherein the second etch produces sidewalls of the first and second hardmask layers which are coplanar with sidewalls of the dielectric layer; and forming an interconnect line in the interconnect line opening.

28. The method of claim 27 wherein the first and second hardmask layers comprise the same material.

* * * * *